United States Patent
Liu

(10) Patent No.: US 10,559,727 B2
(45) Date of Patent: Feb. 11, 2020

(54) MANUFACTURING METHOD OF COLORFUL MICRO-LED, DISPLAY MODLUE AND TERMINALS

(71) Applicant: Shenzhen China Star Optoelectronics Semiconductor Display Technology Co., Ltd., Shenzhen, Guangdong (CN)

(72) Inventor: Minggang Liu, Guangdong (CN)

(73) Assignee: Shenzhen China Star Optoelectronics Semiconductor Display Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 15/739,730

(22) PCT Filed: Sep. 21, 2017

(86) PCT No.: PCT/CN2017/102642
§ 371 (c)(1),
(2) Date: Aug. 2, 2018

(87) PCT Pub. No.: WO2019/019319
PCT Pub. Date: Jan. 31, 2019

(65) Prior Publication Data
US 2019/0035988 A1    Jan. 31, 2019

(30) Foreign Application Priority Data
Jul. 25, 2017  (CN) .......................... 2017 1 0612919

(51) Int. Cl.
*H01L 33/50* (2010.01)
*H01L 33/44* (2010.01)
(Continued)

(52) U.S. Cl.
CPC ........ *H01L 33/507* (2013.01); *H01L 33/0095* (2013.01); *H01L 33/44* (2013.01);
(Continued)

(58) Field of Classification Search
CPC .............. H01L 33/507; H01L 33/0095; H01L 25/0753; H01L 33/44; H01L 33/58
(Continued)

(56) References Cited

U.S. PATENT DOCUMENTS

| 8,294,165 B2 | 10/2012 | Hattori |
| 2010/0032695 A1* | 2/2010 | Fellows-DeMille ........................ H01L 25/0753 257/89 |

(Continued)

FOREIGN PATENT DOCUMENTS

| CN | 101572287 A | * 11/2009 |
| CN | 101572287 A | 11/2009 |

(Continued)

*Primary Examiner* — Sheikh Maruf
(74) *Attorney, Agent, or Firm* — Andrew C. Cheng

(57) ABSTRACT

The present disclosure relates to a manufacturing method of colorful Micro-LEDs. The method includes: bringing the array of the blue-light Micro-LEDs into contact with a first-color photosensitive solution and a second-color photosensitive solution; turning on first preset blue-light Micro-LEDs and the second preset blue-light Micro-LEDs of the array for conducting polymerization on the first and the second preset blue-light Micro-LEDs to form at least one lens. After the lens are formed, the first preset blue-light Micro-LEDs emit the light beams of the first color, the second preset blue-light Micro-LEDs emit the light beams of the second color, and the remaining blue-light Micro-LEDs emit the blue light beams to constitute three colors so as to obtain the colorful Micro-LEDs. In addition, the present disclosure also relates to a display module having the above array of the Micro-LEDs, and a terminal including the display module.

11 Claims, 4 Drawing Sheets

(51) Int. Cl.
*H01L 33/00* (2010.01)
*H01L 33/58* (2010.01)
*H01L 25/075* (2006.01)

(52) U.S. Cl.
CPC .......... *H01L 25/0753* (2013.01); *H01L 33/58* (2013.01); *H01L 2933/005* (2013.01); *H01L 2933/0025* (2013.01); *H01L 2933/0041* (2013.01); *H01L 2933/0058* (2013.01)

(58) Field of Classification Search
USPC ................ 257/401, 89, 98, E33.068; 438/29
See application file for complete search history.

(56) References Cited

U.S. PATENT DOCUMENTS

| | | | |
|---|---|---|---|
| 2010/0109025 A1 | 5/2010 | Bhat | |
| 2010/0110728 A1* | 5/2010 | Dubrow | C09K 11/025 362/615 |
| 2010/0216266 A1* | 8/2010 | Yang | H01J 9/223 438/29 |
| 2011/0001157 A1* | 1/2011 | McKenzie | H01L 33/507 257/98 |
| 2011/0284866 A1* | 11/2011 | Tran | H01L 33/0079 257/76 |
| 2011/0291120 A1* | 12/2011 | Tak | H01L 33/08 257/88 |
| 2012/0161170 A1 | 7/2012 | Dubuc | |
| 2012/0223351 A1* | 9/2012 | Margalit | H01L 33/382 257/98 |
| 2012/0286208 A1* | 11/2012 | McKean | C09K 11/7734 252/301.36 |
| 2012/0288972 A1* | 11/2012 | McKean | C09K 11/025 438/29 |
| 2013/0270587 A1* | 10/2013 | Ouderkirk | H01L 33/60 257/89 |
| 2014/0179029 A1* | 6/2014 | Bhat | H01L 33/0079 438/7 |
| 2015/0144978 A1* | 5/2015 | Miyagawa | C04B 35/44 257/98 |
| 2015/0228869 A1* | 8/2015 | Yoo | H01L 33/54 362/97.3 |
| 2015/0236223 A1* | 8/2015 | Moosburger | H01L 24/24 257/98 |
| 2015/0255439 A1* | 9/2015 | Kim | H01L 25/0753 257/89 |
| 2015/0259597 A1* | 9/2015 | Dubrow | C09K 11/025 438/29 |
| 2015/0267052 A1* | 9/2015 | Tchoul | C08L 83/04 257/98 |
| 2015/0311408 A1* | 10/2015 | Min | H01L 33/52 257/99 |
| 2016/0218240 A1* | 7/2016 | Bouvier | H01L 33/005 |
| 2017/0104139 A1* | 4/2017 | Seo | H01L 27/153 |
| 2017/0200870 A1* | 7/2017 | Chen | H01L 33/507 |
| 2017/0238419 A1* | 8/2017 | Herner | H01L 27/153 362/84 |
| 2018/0301594 A1* | 10/2018 | Bouvier | H01L 33/0095 |
| 2019/0371856 A1* | 12/2019 | Cha | H01L 27/156 |

FOREIGN PATENT DOCUMENTS

| | | | |
|---|---|---|---|
| CN | 205810814 A | | 12/2016 |
| CN | 106356386 A | * | 1/2017 |
| CN | 106356386 A | | 1/2017 |
| CN | 106876562 A | | 6/2017 |

* cited by examiner

MANUFACTURING METHOD OF COLORFUL MICRO-LED, DISPLAY MODLUE AND TERMINALS

BACKGROUND OF THE INVENTION

1. Field of the Invention

The present disclosure relates to Micro-LED technology, and more particularly to a manufacturing method of colorful Micro-LED, a display module, and a terminal.

2. Discussion of the Related Art

LEDs are characterized by attributes, including not only as self-luminous, small size, light weight, high brightness, but also longer life cycle, lower power consumption, faster response time, and more controllable advantages. Micro-LED relates to the LED structure designed to be thinning and miniaturization, and the size of the array is only 1-10 um level. Micro-LED display module is formed by transferring the Micro-LED in a batch manner to the circuit board, and then the protective layer and the electrode are formed. In the end, the components are encapsulated.

Generally, the Micro-LED is monochrome. There is no colorful Micro-LED display module. To provide colorful light beams by the Micro-LED display module, the Micro-LEDs of different colors have to be transferred to the circuit board in a batch manner for many times. However, the above transfer technology is very difficult, and the accuracy may be low. Thus, the yield is very poor, which make the mass production very difficult.

SUMMARY

The present disclosure relates to a manufacturing method of colorful Micro-LEDs, a display module, and a terminal, wherein the Micro-LED may emit colorful light beams without utilizing transfer technology.

In one aspect, a manufacturing method of colorful Micro-LEDs includes: providing a substrate, wherein one side of the substrate is configured with an array having a plurality of blue-light micro-LEDs; bringing the array of the blue-light Micro-LEDs into contact with a first-color photosensitive solution; turning on first preset blue-light Micro-LEDs of the array for conducting polymerization on the first preset blue-light Micro-LEDs to form at least one lens; bringing the array of the blue-light Micro-LEDs into contact with a second-color photosensitive solution; turning on second preset blue-light Micro-LEDs of the array for conducting the polymerization on the second preset blue-light Micro-LEDs to form the at least one lens.

In view of the above, the blue-light Micro-LEDs of the array are brought into contact with photosensitive solutions of different colors. After being contacted with the photosensitive solution of the first color, the first preset blue-light Micro-LEDs 200 are turned on. At this moment, the first preset blue-light Micro-LED 200 emit blue light beams reacting with the photosensitive solution of the first color. After contacting with the photosensitive solution of the second color, the second preset blue-light Micro-LEDs 200 are turned on. At this moment, the second preset blue-light Micro-LEDs 200 emit the blue light beams reacting with the photosensitive solutions of the second color to conduct the polymerization. At this moment, the Micro-LEDs other than the second preset blue-light Micro-LEDs may not react with the photosensitive solutions of the first color, such that the second preset blue-light Micro-LEDs 200 emit the light beams of the second color. The Micro-LEDs that have not been turned on and that have not reacted with the photosensitive solutions of the first color and the second color constitute three colors, such that the Micro-LEDs are capable of emitting colorful light beams.

In another aspect, a display module includes the array of Micro-LEDs manufactured by the above manufacturing method.

In another aspect, a terminal includes the above display module.

In view of the above, the array of the Micro-LED may be configured according to the dimensions of the display module and the terminal. The appropriate number of Micro-LED may be configured accordingly. Not only can the colorful light beams may be emitted, but also the transfer process usually adopted in the conventional solution may be excluded. As a result, the yield rate of the products may be enhanced so as to enhance the performance.

DETAILED DESCRIPTION OF THE EMBODIMENTS

Embodiments of the invention will now be described more fully hereinafter with reference to the accompanying drawings, in which embodiments of the invention are shown.

Figure 1:
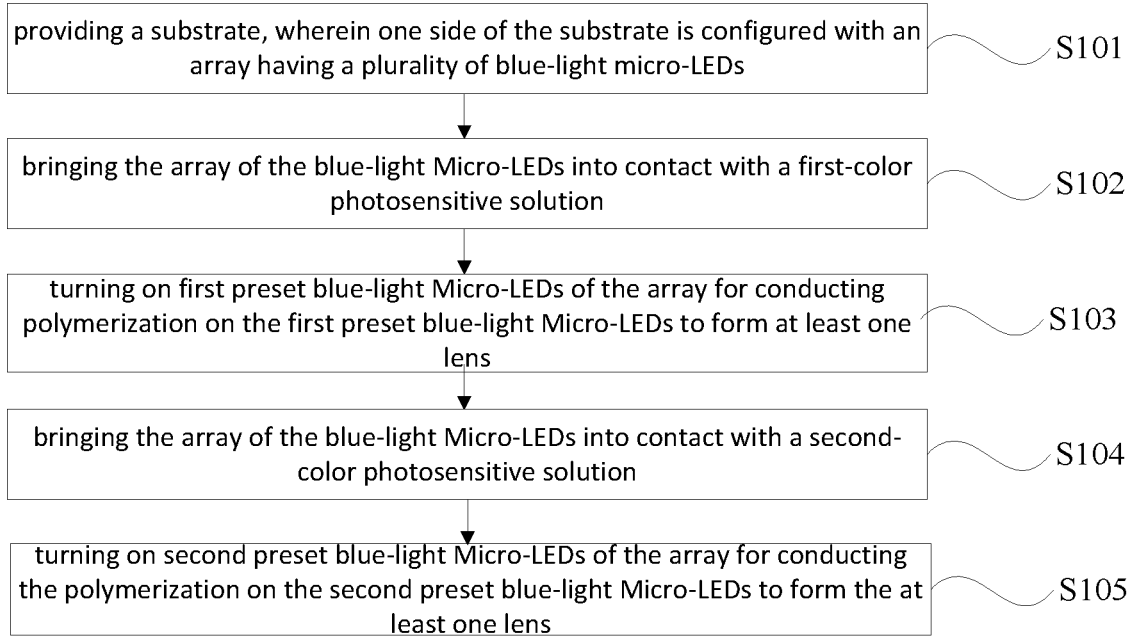
FIG. 1 is a flowchart illustrating a manufacturing method of colorful Micro-LED in accordance with one embodiment of the present disclosure.

FIG. 1 is a flowchart illustrating a manufacturing method of colorful Micro-LED in accordance with one embodiment of the present disclosure. The method includes:

In step S101: providing a substrate 10, wherein one side of the substrate 10 is configured with an array 20 having a plurality of blue-light micro-LEDs 400.

Figure 2:
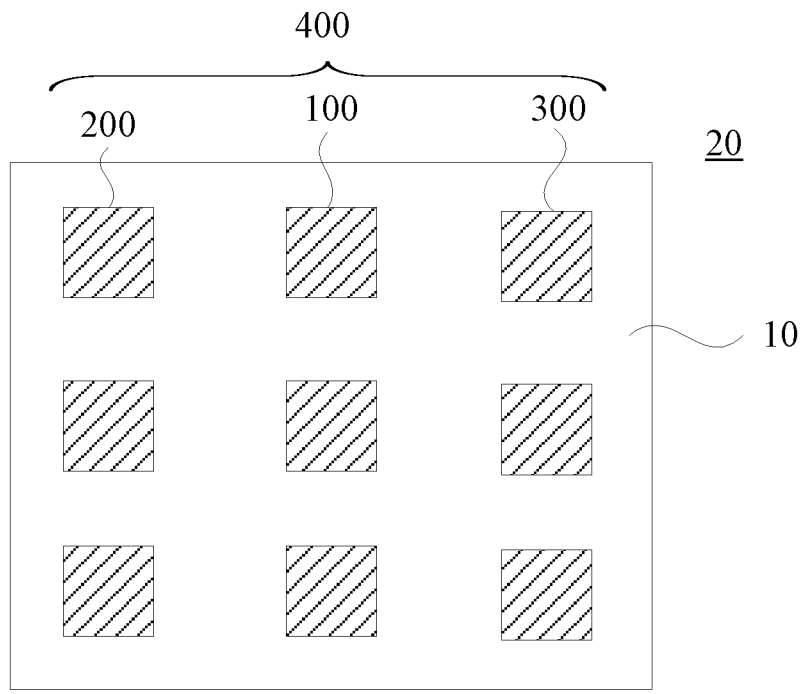
FIG. 2 is a schematic view showing the a plurality of blue-light Micro-LED arranged on a substrate in accordance with one embodiment of the present disclosure.

The substrate 10 may be made of one or more of sapphire, silicon, or silicon carbide. Also referring to FIG. 2, the blue-light micro-LEDs 400 is configured as an array formed on the substrate 10, and the blue-light Micro-LEDs 400 is classified into three types: the first preset blue-light Micro-LED 100, the second preset blue-light Micro-LED 200, and blue-light Micro-LED 300.

In step S102, the array 20 of the blue-light Micro-LEDs 400 is brought into contact with the first-color photosensitive solution Specifically, the array 20 of the blue-light Micro-LEDs 400 is immersed into the solution, or the solution is sprayed on the array 20 of the blue-light Micro-LEDs 400. It can be understood that the array 20 of the blue-light Micro-LEDs 400 may be brought into contact with the first-color photosensitive solution by other methods.

In step S103, first preset blue-light Micro-LEDs 100 of the array 20 are turned on such that the first preset blue-light Micro-LEDs 100 conduct polymerization.

Figure 3:
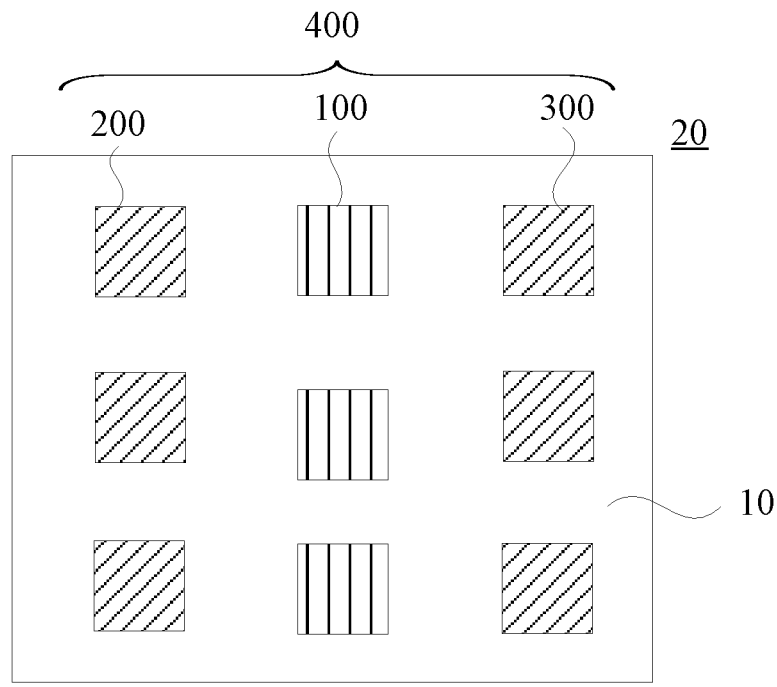
FIG. 3 is a schematic view showing the Micro-LED after the step S103 of the manufacturing method of the colorful Micro-LED in accordance with one embodiment of the present disclosure.

Referring to FIG. 3, the first preset blue-light Micro-LEDs 100 of the blue-light Micro-LEDs 400 of the array 20 are turned on, such that the first preset blue-light Micro-LED 100 reacts on the lens. After this step, the first preset blue-light Micro-LED 100 may emit the light beams of a first color. Specifically, after the polymerization, the lens forms a color element of the first color. In particular, when the first preset blue-light Micro-LEDs 100 are turned on, the resin component in the photosensitive solution is triggered to conduct the polymerization. The photosensitive resin core is formed on the surface of the Micro-LED 100. As the substrate 10 may be slowly rising, the photosensitive resin core surface forms a photosensitive resin drop, and the resin core and the photosensitive resin are solidified to form a lens.

In step S104, the array 20 of the blue-light Micro-LEDs 400 is brought into contact with a second-color photosensitive solution.

This step is similar to the step S102, and thus the descriptions are omitted hereinafter.

In step S105, the second preset blue-light Micro-LEDs 200 of the array 20 are turned on to conduct the polymerization on the second preset blue-light Micro-LEDs 200.

Figure 4:
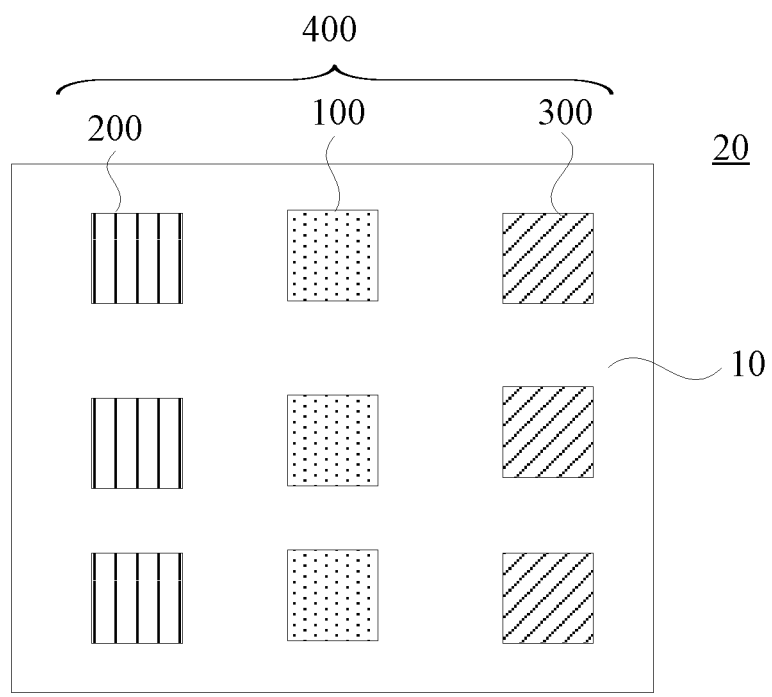
FIG. 4 is a schematic view showing the Micro-LED after the step S105 of the manufacturing method of the colorful Micro-LED in accordance with one embodiment of the present disclosure.

Referring to FIG. 4, the second preset blue-light Micro-LEDs 200 of the blue-light Micro-LEDs 400 of the array 20 are turned on, such that the second preset blue-light Micro-LEDs 200 conduct the polymerization. After this step, the second preset blue-light Micro-LEDs 200 may emit the light beams of a second color. Specifically, after the polymerization, the lens forms a color element of the second color.

In view of the above, the blue-light Micro-LEDs 400 of the array 20 are brought into contact with photosensitive solutions of different colors. After being contacted with the photosensitive solution of the first color, the first preset blue-light Micro-LEDs 100 are turned on. At this moment, the first preset blue-light Micro-LED 100 emit blue light beams reacting with the photosensitive solution of the first color. After conducting the polymerization, the first preset blue-light Micro-LEDs 100 emit the light beams of the first color. At the same time, the Micro-LEDs other than the first preset blue-light Micro-LED 100 may not react with the photosensitive solution of the first color. After contacting with the photosensitive solution of the second color, the second preset blue-light Micro-LEDs 200 are turned on. At this moment, the second preset blue-light Micro-LEDs 200 emit the blue light beams reacting with the photosensitive solutions of the second color to conduct the polymerization. At this moment, the Micro-LEDs other than the second preset blue-light Micro-LEDs 200 may not react with the photosensitive solutions of the first color, such that the second preset blue-light Micro-LEDs 200 emit the light beams of the second color. The Micro-LEDs that have not been turned on and that have not reacted with the photosensitive solutions of the first color and the second color, i.e., the blue-light Micro-LEDs 300, constitute three colors, such that the Micro-LEDs are capable of emitting colorful light beams.

In an example, the first color and the second color are respectively red and green. After conducting the polymerization, the first preset blue-light Micro-LED 100 forms the red pixels, and the second preset blue-light Micro-LEDs 200 forms the green pixels. Thus, three colors forms the three original colors. The colorful Micro-LEDs may be obtained by configuring the red, the green, and the blue.

It can be understood that, in other embodiments, the first color and the second color may respectively be the green and the red. That, after performing the polymerization, the first preset blue-light Micro-LED 100 forms the green pixels, and the second preset blue-light Micro-LEDs 200 forms the red pixels.

In another example, the second preset blue-light Micro-LED 200 and the blue-light Micro-LED 300 are configured in a rim of each of the first preset blue-light Micro-LEDs 100. With such configuration, after the steps S102, S103, S104, and S105, the first preset blue-light Micro-LED 100 may emit the red light beams, or green light beams. The second preset blue-light Micro-LEDs 200 may emit green light beams, or red light beams. Further cooperating with the blue-light Micro-LED 300 emitting blue light beams, the pixel including red, green, and blue original colors may be obtained. One side of the substrate is configured with a plurality of the above pixels to achieve colorful Micro-LEDs.

Figure 5:
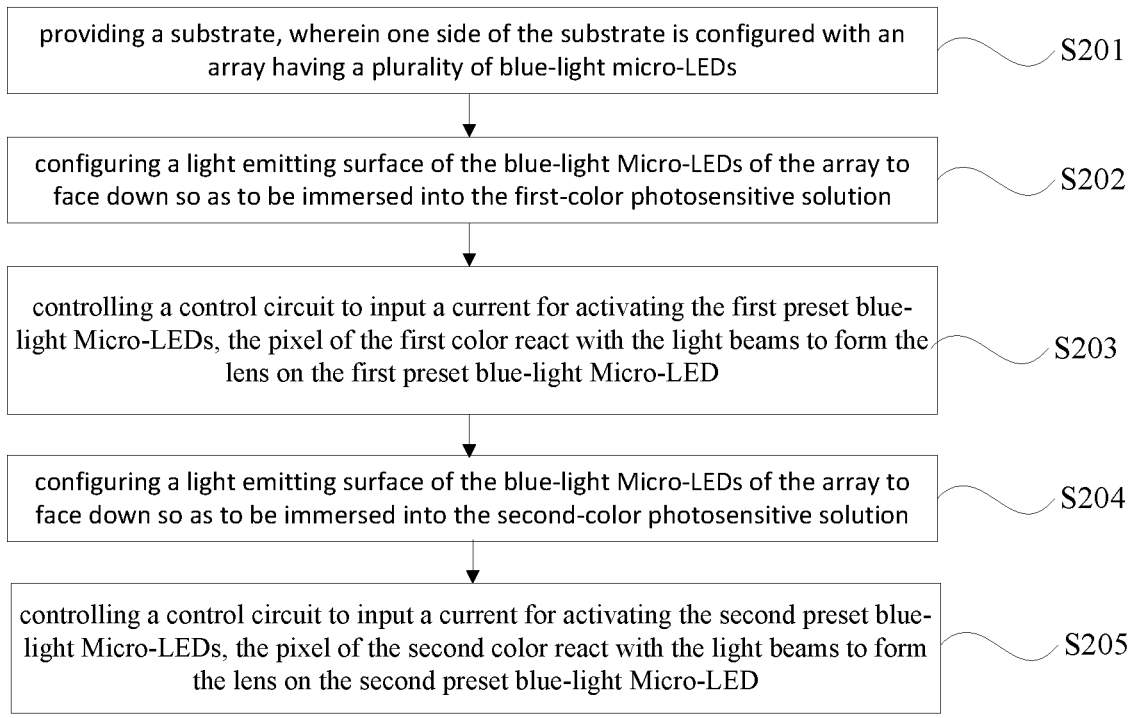
FIG. 5 is a flowchart illustrating a manufacturing method of colorful Micro-LED in accordance with another embodiment of the present disclosure.

FIG. 5 is a flowchart illustrating a manufacturing method of colorful Micro-LED in accordance with another embodiment of the present disclosure. The method includes the following steps:

In step S201: providing a substrate 10, and one side of the substrate 10 being configured with an array 20 having a plurality of blue-light Micro-LEDs 400.

In step S202: configuring a light emitting surface of the blue-light Micro-LEDs 400 of the array 20 to face down so as to be immersed into a first-color photosensitive solution.

The light emitting surface of the blue-light Micro-LEDs 400 faces down so as to be immersed, and the light emitting surface aligns with one side of the Micro-LEDs to provide the circuit configured on the other side of the substrate 10. In an example, a portion of the blue-light Micro-LEDs 400 may be immersed, as long as the blue-light Micro-LEDs 400 may react with the photosensitive resin solution to form the lens. It can be understood that, in other embodiments, when the circuit has been sealed well, the light emitting surface of the blue-light Micro-LEDs 400 may face upward, and the whole substrate 10 is immersed within the photosensitive resin solution of the first color.

In step S203: controlling a control circuit to input a current for activating the first preset blue-light Micro-LED 100 to emit the light beams, the pixels of the first color react with the light beams to form the lens on the first preset blue-light Micro-LED 100.

In this step, only the first preset blue-light Micro-LEDs 100 are electrified so as to emit the light beams. The second preset blue-light Micro-LEDs 200 and the blue-light Micro-LED 300 are not electrified. It can be understood, in other embodiments, the first preset blue-light Micro-LED 100 may be turned on by other methods, such as batteries or solar energy. In an example, the current is less than 30 mA.

In step S204, configuring the light emitting surface of the blue-light Micro-LEDs 400 to face downward so as to be immersed within the second-color photosensitive solution. This step is similar to the step S202, and thus the descriptions are omitted hereinafter.

In step S205, controlling the control circuit to input the current for activating the second preset blue-light Micro- LED 200 to emit the light beams, the pixels of the second color react with the light beams to form the lens on the second preset blue-light Micro-LED 200. This step is similar to the step S203, and thus the descriptions are omitted hereinafter.

It can be understood that the control circuit includes a first control circuit and a second control circuit. The first control circuit connects to the first preset blue-light Micro-LED 100, and the second control circuit connects to the second preset blue-light Micro-LEDs 200. The first control circuit connects to all of the first preset blue-light Micro-LED 100 on one side of the substrate 10, and the second control circuit connects to all of the second preset blue-light Micro-LEDs 200 on one side of the substrate 10.

In an example, the first-color and the second-color photosensitive resin solution may include photosensitive resin, phosphors, and/or quantum dots pigments. Further, the photosensitive resin includes a photo-initiator, and one or a combination of resin monomers, pre-polymers, adjuvants and nanoparticles for resin modification.

In an example, as the quantum dot pigment has good light stability, the quantum intensity of the quantum dot pigment is higher than that of other phosphors. For example, it is 20 times higher than the most commonly used organic fluorescent material "rhodamine 6G," and thus the stability is above 100 times than "rhodamine 6G." Therefore, compared with the phosphor, the display module formed by the quantum dot pigment has better luminous efficiency, and color saturation.

Secondly, since the quantum dot pigment has a wide excitation spectrum and a narrow emission spectrum, the same excitation light source may be adopted to stimulate several electrons, and thus the efficiency of Blu-ray conversion may be greatly enhanced.

In an example, the weight of the photo-initiator is less than or equal to 5%.

In an example, the content of the phosphor and/or the quantum dot pigment is from 1% to 1.5%.

In an example, after the step S203 and/or S205, the method further includes: controlling a control circuit to input a current for activating the first preset blue-light Micro-LED 100 and/or the second preset blue-light Micro-LEDs 200 to emit the light beams again, the photosensitive resin solution, the photosensitive resin core and the photosensitive resin drier are further cured to form a lens. Specifically, the current is less than 30 mA.

Figure 6:
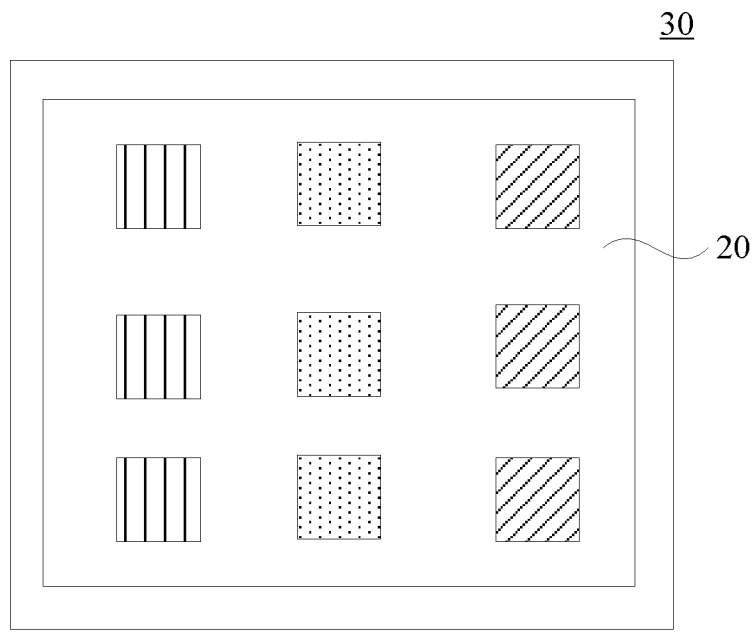
FIG. 6 is a schematic view of the display module in accordance with one embodiment of the present disclosure.

FIG. 6 is a schematic view of the display module 30 in accordance with one embodiment of the present disclosure. The display module 30 includes the array 20 having the blue-light Micro-LEDs 400 manufactured by any one of the above methods.

Figure 7:
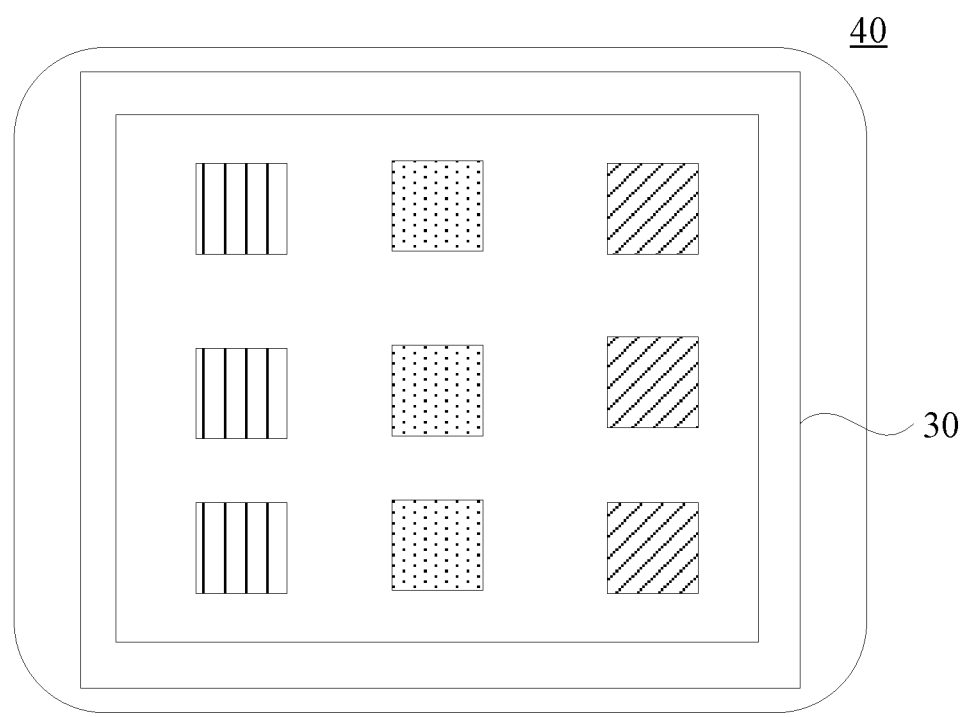
FIG. 7 is a schematic view of the terminal in accordance with one embodiment of the present disclosure.

FIG. 7 is a schematic view of the terminal 40 in accordance with one embodiment of the present disclosure. The terminal 40 includes the above display module 30 having the Micro-LEDs.

In view of the above, the Micro-LEDs of the display module 30 and the terminal 40 may emit colorful light beams, which greatly improves the superiority of the product, enriches the performance of the product and improves the user's experience. In addition, the array 20 having the Micro-LEDs 400 may configure a corresponding matching of the Micro-LEDs according to the specifications of the display module 30 and the terminal 40, thereby excluding the conventional transfer process required by the colorful Micro-LEDs. Thus, the yield of products may be enhanced to ensure product performance.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A manufacturing method of colorful Micro-LEDs, comprising:
   providing a substrate, wherein one side of the substrate is configured with an array having a plurality of blue-light micro-LEDs; the plurality of blue-light micro-LEDs comprise first preset blue-light Micro-LEDs, second preset blue-light Micro-LEDs, and third preset blue-light Micro-LEDs; wherein the first preset blue-light Micro-LEDs are disposed between the second preset blue-light Micro-LEDs and the third preset blue-light Micro-LEDs;
   configuring a light emitting surface of the blue-light Micro-LEDs of the array to face upward and immersing the whole substrate into the first-color photosensitive solution;
   turning on only the first preset blue-light Micro-LEDs of the array without turning on the second preset blue-light Micro-LEDs and the third preset blue-light Micro-LEDs for conducting polymerization on the first preset blue-light Micro-LEDs to form at least one first lens, and forming a first-color pixel on the at least one first lens;
   after the at least one first lens and the first-color pixel are formed, configuring the light emitting surface of the blue-light Micro-LEDs of the array to face upward and immersing the whole substrate into the second-color photosensitive solution;
   turning on only the second preset blue-light Micro-LEDs of the array without turning on the first preset blue-light Micro-LEDs and the third preset blue-light Micro-LEDs for conducting the polymerization on the second preset blue-light Micro-LEDs to form at least one second lens, and forming a second-color pixel on the at least one second lens;
   wherein the first-color pixel is one of a red pixel and a green pixel, and the second-color pixel is the other of the red pixel and the green pixel.

2. The manufacturing method as claimed in claim 1, wherein the step of turning on only the first preset blue-light Micro-LEDs of the array without turning on the second preset blue-light Micro-LEDs and the third preset blue-light Micro-LEDs for conducting polymerization on the first preset blue-light Micro-LEDs to form at least one first lens further comprises:
   controlling a control circuit to input a first current for activating the first preset blue-light Micro-LEDs to emit light beams without electrifying the second preset blue-light Micro-LEDs and the third preset blue-light Micro-LEDs, the first-color pixels of the first color and the second color react with the light beams, such that a first photosensitive resin core and a first photosensitive resin drier are formed to form the first lens on the first preset blue-light Micro-LED;
   wherein the step of turning on only the second preset blue-light Micro-LEDs of the array without turning on the first preset blue-light Micro-LEDs and the third preset blue-light Micro-LEDs for conducting the polymerization on the second preset blue-light Micro-LEDs to form at least one second lens further comprises:

controlling the control circuit to input a second current for activating the second preset blue-light Micro-LEDs to emit light beams without electrifying the first preset blue-light Micro-LEDs and the third preset blue-light Micro-LEDs, wherein the second-color pixels react with the light beams, such that a second photosensitive resin core and a second photosensitive resin drier are formed to form the second lens on the second preset blue-light Micro-LED.

3. The manufacturing method as claimed in claim 2, wherein the control circuit comprises a first control circuit and a second control circuit, the first control circuit connects to the first preset blue-light Micro-LEDs, and the second control circuit connects to the second preset blue-light Micro-LEDs.

4. The manufacturing method as claimed in claim 1, wherein the first-color and the second-color photosensitive resin solution comprise photosensitive resin, phosphors, and quantum dots pigments.

5. The manufacturing method as claimed in claim 4, wherein the photosensitive resin comprises a photo-initiator, one or a combination of resin monomers, pre-polymers, adjuvants and nanoparticles for resin modification, and a weight of the photo-initiator is less than or equal to 5%.

6. The manufacturing method as claimed in claim 4, wherein a total content of the phosphor and the quantum dot pigment is in a range from 1% to 1.5%.

7. A display module comprising the array of Micro-LEDs manufactured by the manufacturing method of claim 1.

8. A terminal comprising the display module as claimed in claim 7.

9. The manufacturing method as claimed in claim 2, wherein after the step of controlling a control circuit to input a first current for activating the first preset blue-light Micro-LEDs to emit light beams without electrifying the second preset blue-light Micro-LEDs and the third preset blue-light Micro-LEDs, the method further comprises:

controlling the control circuit to input a third current for further activating the first preset blue-light Micro-LED to emit the light beams, such that the photosensitive resin solution, the first photosensitive resin core and the first photosensitive resin drier are cured to form the first lens; wherein the third current is greater than the first current.

10. The manufacturing method as claimed in claim 9, wherein after the step of controlling the control circuit to input a second current for activating the second preset blue-light Micro-LEDs to emit light beams without electrifying the first preset blue-light Micro-LEDs and the third preset blue-light Micro-LEDs, the method further comprises:

controlling the control circuit to input a fourth current for further activating the second preset blue-light Micro-LED to emit the light beams, such that the photosensitive resin solution, the second photosensitive resin core and the second photosensitive resin drier are cured to form the second lens; wherein the fourth current is greater than the second current.

11. The manufacturing method as claimed in claim 10, wherein the first current and the second current are less than 30 mA; the third current and the fourth current are greater than 30 mA.

* * * * *